United States Patent
Aydin et al.

(10) Patent No.: US 12,077,852 B2
(45) Date of Patent: Sep. 3, 2024

(54) METAL-DOPED BORON FILMS

(71) Applicant: Applied Materials, Inc., Santa Clara, CA (US)

(72) Inventors: Aykut Aydin, Sunnyvale, CA (US); Rui Cheng, San Jose, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 605 days.

(21) Appl. No.: 17/240,395

(22) Filed: Apr. 26, 2021

(65) Prior Publication Data

US 2022/0341034 A1 Oct. 27, 2022

(51) Int. Cl.
| | |
|---|---|
| *C23C 16/04* | (2006.01) |
| *C23C 16/18* | (2006.01) |
| *C23C 16/40* | (2006.01) |
| *C23C 22/77* | (2006.01) |
| *C23C 22/82* | (2006.01) |

(52) U.S. Cl.
CPC ............ *C23C 16/042* (2013.01); *C23C 16/18* (2013.01); *C23C 16/402* (2013.01); *C23C 22/77* (2013.01); *C23C 22/82* (2013.01)

(58) Field of Classification Search
CPC ..... C23C 16/042; C23C 16/18; C23C 16/402; C23C 16/22; C23C 16/26; C23C 16/5096; C23C 22/77; C23C 22/82; H01L 21/02112; H01L 21/02274; H01L 21/31144
See application file for complete search history.

(56) References Cited

U.S. PATENT DOCUMENTS

| | | | | |
|---|---|---|---|---|
| 8,278,207 | B2 * | 10/2012 | Park | H10B 41/30 438/653 |
| 8,337,950 | B2 * | 12/2012 | Nguyen | H01L 21/02271 427/255.394 |
| 2017/0092505 | A1 | 3/2017 | Nakao et al. | |
| 2017/0207087 | A1 | 7/2017 | Roy et al. | |
| 2018/0033622 | A1 | 2/2018 | Swaminathan et al. | |
| 2018/0218902 | A1 | 8/2018 | Venkatasubramanian et al. | |
| 2020/0075341 | A1 | 3/2020 | Matsubara et al. | |

OTHER PUBLICATIONS

Application No. PCT/US2022/025281, International Search Report and Written Opinion, Mailed on Aug. 9, 2022, 10 pages.

* cited by examiner

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary deposition methods may include delivering a boron-containing precursor to a processing region of a semiconductor processing chamber. The methods may include delivering a dopant-containing precursor with the boron-containing precursor. The dopant-containing precursor may include a metal. The methods may include forming a plasma of all precursors within the processing region of the semiconductor processing chamber. The methods may include depositing a doped-boron material on a substrate disposed within the processing region of the semiconductor processing chamber. The doped-boron material may include greater than or about 80 at. % of boron in the doped-boron material.

19 Claims, 2 Drawing Sheets

METAL-DOPED BORON FILMS

TECHNICAL FIELD

The present technology relates to semiconductor deposition processes. More specifically, the present technology relates to methods of depositing materials with metal dopants that may be used as masking materials.

BACKGROUND

Integrated circuits are made possible by processes which produce intricately patterned material layers on substrate surfaces. Producing patterned structures on a substrate requires controlled methods of formation and removal of exposed material. As device sizes continue to shrink, and structures become more complex, material properties may affect subsequent operations. For example, masking materials may affect both the ability to develop structures as well as the ability to selectively remove materials.

Thus, there is a need for improved systems and methods that can be used to produce high quality devices and structures. These and other needs are addressed by the present technology.

SUMMARY

Exemplary deposition methods may include delivering a boron-containing precursor to a processing region of a semiconductor processing chamber. The methods may include delivering a dopant-containing precursor with the boron-containing precursor. The dopant-containing precursor may include a metal. The methods may include forming a plasma of all precursors within the processing region of the semiconductor processing chamber. The methods may include depositing a doped-boron material on a substrate disposed within the processing region of the semiconductor processing chamber. The doped-boron material may include greater than or about 80 at. % of boron in the doped-boron material.

In some embodiments, a metal dopant concentration within the film may be maintained at less than or about 20 at. %. The metal in the dopant-containing precursor may be or include one or more of tungsten, molybdenum, titanium, aluminum, cobalt, ruthenium, or tantalum. The dopant-containing precursor may be or include tungsten hexafluoride or tungsten hexacarbonyl. The doped-boron material may be characterized by an extinction coefficient of less than or about 0.45 at 633 nm. The methods may include delivering an oxygen-containing precursor or a nitrogen-containing precursor with the boron-containing precursor. An oxygen content or a nitrogen content within the doped-boron material may be maintained at less than or about 10%. The doped-boron material may be characterized by a hardness of greater than or about 25 GPa. The substrate may include silicon oxide. The deposition method may include etching the silicon oxide. The silicon oxide may etch at a rate greater than or about five times the rate at which the doped-boron material is etched.

Some embodiments of the present technology may encompass deposition methods. The methods may include delivering a boron-containing precursor to a processing region of a semiconductor processing chamber. The methods may include forming a plasma of the boron-containing precursor within the processing region of the semiconductor processing chamber. The methods may include forming a first layer of boron-containing material on a substrate disposed within the processing region of the semiconductor processing chamber. The methods may include adding a dopant-containing precursor with the boron-containing precursor. The dopant-containing precursor may include a metal. The methods may include forming a second layer of a doped-boron material on the first layer of boron-containing material to produce a bilayer film.

In some embodiments, a metal dopant concentration within the second layer of the bilayer film may be maintained at less than or about 10 at. %. The metal in the dopant-containing precursor may be or include one or more of tungsten, molybdenum, titanium, aluminum, cobalt, ruthenium, or tantalum. The second layer of the doped-boron material may be greater than or about 50% of a thickness of the bilayer film. The doped-boron material may be characterized by a hardness of greater than or about 25 GPa. The substrate may include silicon oxide, and the deposition method may include etching the silicon oxide. The silicon oxide may etch at a rate greater than or about 1.5 times the rate at which the bilayer film is etched.

Some embodiments of the present technology may encompass deposition methods. The methods may include delivering a boron-containing precursor to a processing region of a semiconductor processing chamber. The methods may include delivering a dopant-containing precursor with the boron-containing precursor. The dopant-containing precursor may include a metal. The methods may include forming a plasma of all precursors within the processing region of the semiconductor processing chamber. The methods may include depositing a doped-boron material on a substrate disposed within the processing region of the semiconductor processing chamber. In some embodiments, the doped-boron material may include less than or about 10 at. % of metal in the doped-boron material. The metal in the dopant-containing precursor may include one or more of tungsten, molybdenum, titanium, aluminum, cobalt, ruthenium, or tantalum. The doped-boron material may be characterized by an extinction coefficient of less than or about 0.45 at 633 nm. The substrate may include silicon oxide, and the deposition method may include etching the silicon oxide. The silicon oxide may etch at a rate greater than or about five times the rate at which the doped-boron material is etched.

Such technology may provide numerous benefits over conventional systems and techniques. For example, the processes may produce films characterized by improved selectivity relative to underlying materials. Additionally, the operations of embodiments of the present technology may produce improved mask materials that may facilitate processing operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. Mask materials may be used to allow materials to be at least partially etched to produce features across the substrate. As device sizes continue to reduce, and improved selectivity between materials may ease structural formation, utilizing improved hard masks may facilitate fabrication. For example, future DRAM nodes may require taller capacitor structures, which may involve forming deeper trenches on a substrate. Conventional hardmasks may reach a limitation in selectivity relative to underlying silicon materials. Accordingly, many semiconductor fabrication processes are utilizing thicker hardmask films for larger vertical device structures, or attempting to develop mask materials characterized by increased hardness. However, while a hardmask may be characterized by a sufficient transparency at one thickness, as the thickness increases, the film may become less transparent. When a film becomes sufficiently opaque, processes may require additional operations to open areas near alignment markers to ensure correct orientation. Additionally, thicker hard mask films may challenge patterning, which may in turn affect uniformity of transfer into the underlying structure.

The present technology may overcome these limitations by producing mask materials that incorporate metal dopants. Although these materials may counterintuitively reduce transparency and hardness, the materials may be more selective to underlying materials, which may afford reduced thickness masks, and which overall may improve etching and structural formation in semiconductor substrates. It is to be understood that the present technology is not intended to be limited to the specific films and processing discussed, as the techniques described may be used to improve a number of film formation processes, and may be applicable to a variety of processing chambers and operations.

Figure 1:
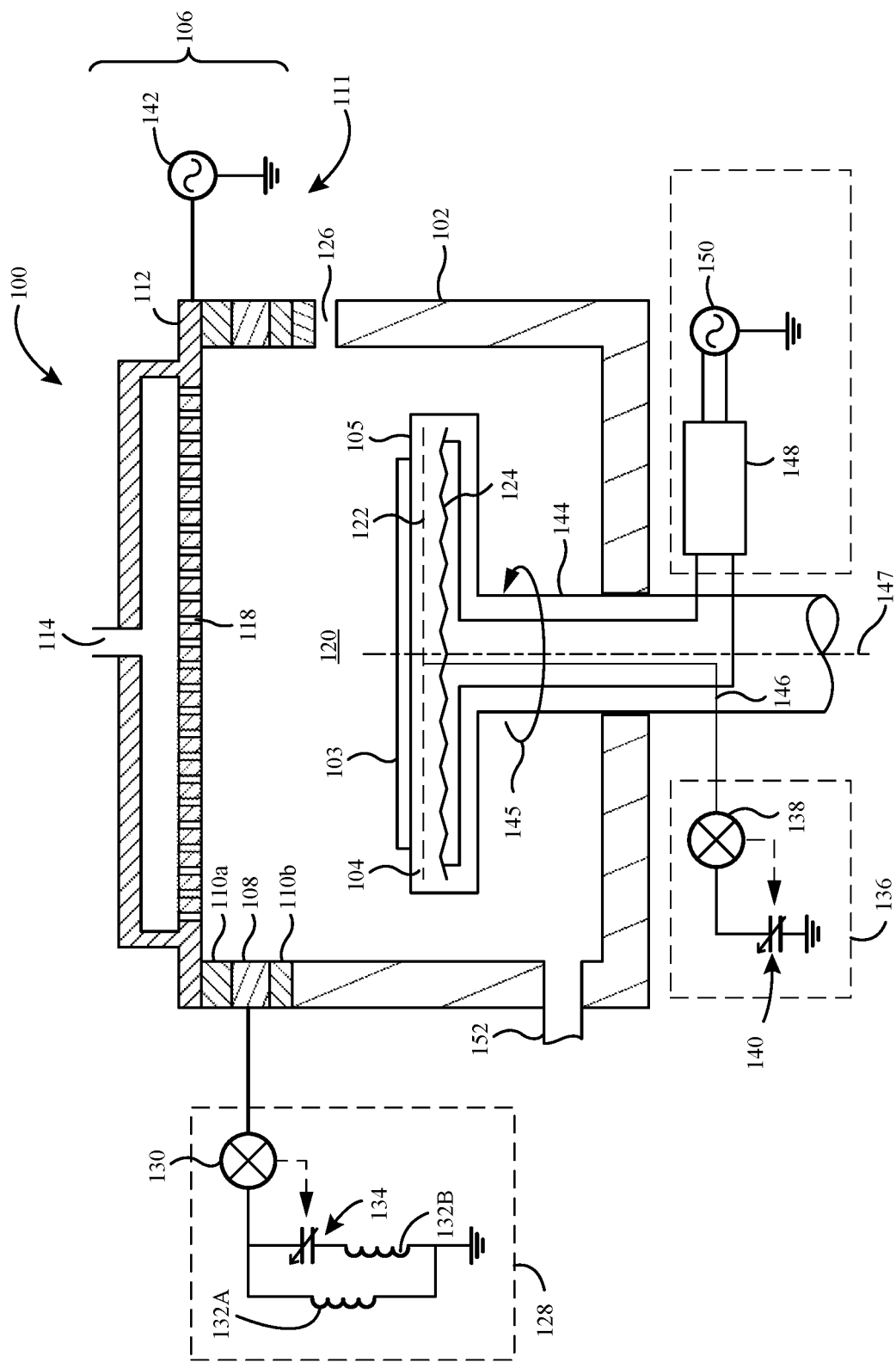
FIG. 1 shows a schematic cross-sectional view of an exemplary processing chamber according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
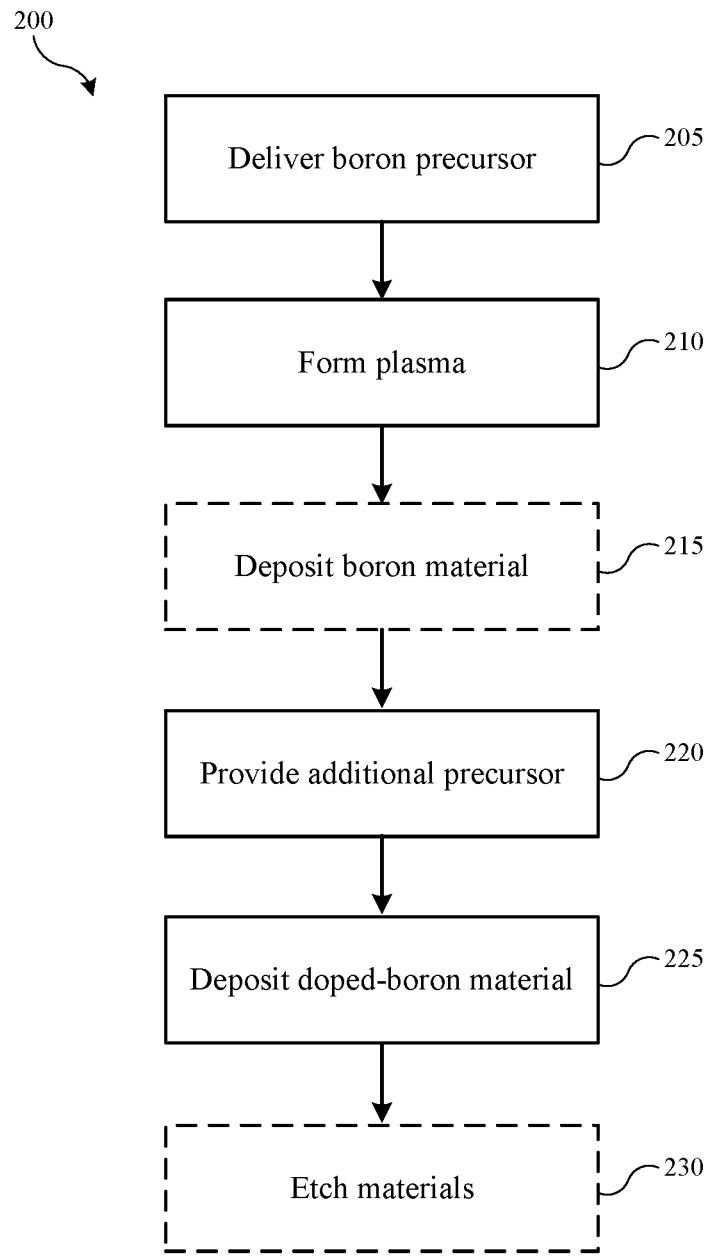
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

The substrate may be or include any number of materials on which materials may be deposited. The substrate may be or include silicon, germanium, dielectric materials including silicon oxide or silicon nitride, metal materials, or any number of combinations of these materials, which may be the substrate, or materials formed on the substrate. In some embodiments optional treatment operations, such as a pretreatment, may be performed to prepare a surface of the substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, may be adsorbed, reacted, or formed on a surface of the substrate. Additionally, material removal may be performed, such as reduction of native oxides or etching of material, or any other operation that may prepare one or more exposed surfaces of the substrate for deposition.

At operation 205, one or more precursors may be delivered to the processing region of the chamber. For example, the film being deposited may be a mask film used in semiconductor processing. The deposition precursors may include any number of mask precursors, including one or more boron-containing precursors. The precursors may be flowed together or separately. For example, in exemplary embodiments in which a boron-containing film may be formed, at least one boron-containing precursor may be delivered to the processing region of the processing chamber. Plasma enhanced deposition may be performed in some embodiments of the present technology, which may facilitate material reactions and deposition. For example, at operation 210, a plasma may be formed of the boron-containing precursors, and a boron-containing material may be deposited at optional operation 215.

Boron-containing hardmasks may be characterized by relatively high hardness, which may improve etch selectivity. However, to further improve etch selectivity over underlying silicon-containing materials, such as silicon oxide or silicon nitride, the present technology may incorporate one or more dopant materials, which may include one or more metals. Incorporating a metal may be counterintuitive in hard mask formation, especially with a goal of increasing properties for selective etching. For example, incorporating a metal into the hard mask may actually reduce film hardness, which many conventional technologies may avoid as they seek harder mask films. Additionally, metal dopants may reduce film transparency, which may challenge lithography operations by producing a more opaque film, challenging mask thicknesses that may be increased as used conventionally. However, the present technology utilizes metal dopants to increase selectivity of etch operations, which may overcome reductions in film hardness. Additionally, because the selectivity of etching may be improved compared to non-metal doped films, masks according to some embodiments of the present technology may be characterized by reduced thickness, which may improve film transparency. For example, as conventional technologies seek to increase depth of structures formed, a thicker hard mask may be provided. As silicon, boron, and germanium films increase in thickness, they may be characterized by a greater opaque nature, which may challenge lithography. By incorporating metal materials, the present technology may reverse this need for thicker mask films.

Accordingly, some embodiments of the present technology may include additionally providing a dopant-containing precursor at operation 220, and which is provided with the other deposition precursors. The precursors delivered may all be used to form a plasma within the processing region of the semiconductor processing chamber at operation 210 as explained above, and thus the order of operations as shown in method 200 may include operations occurring in different orders, including concurrently. At operation 225, a material may be deposited on the substrate that includes the metal dopant within the deposited material. By incorporating the dopant-containing precursor in some embodiments, selectivity of etching may be increased, while producing a film with controlled hardness and transparency.

Depending on the precursors used, a flow rate of the dopant precursor may be used to control incorporation of the dopant. For example, such as for a transition-metal dopant, while the flow rates of the other deposition precursors may be hundreds of sccm or more, the dopant precursor may be flowed at a flow rate less than or about 250 sccm, and may be delivered at a flow rate less than or about 200 sccm, less than or about 150 sccm, less than or about 100 sccm, less than or about 50 sccm, less than or about 40 sccm, less than or about 30 sccm, less than or about 25 sccm, less than or about 20 sccm, less than or about 15 sccm, less than or about 10 sccm, less than or about 5 sccm, or less.

Any number of precursors may be used with the present technology with regard to the boron-containing precursor. For example, boron-containing materials may include boranes, such as borane, diborane, or other multicenter-bonded boron materials, as well as any other boron-containing materials that may be used to produce boron-containing materials. The boron incorporation in the produced film may be based on any percentage incorporation. For example, the produced film may include greater than or about 50% boron incorporation, and in some embodiments may include greater than or about 55% boron incorporation, greater than or about 60% boron incorporation, greater than or about 65% boron incorporation, greater than or about 70% boron incorporation, greater than or about 75% boron incorporation, greater than or about 80% boron incorporation, greater than or about 85% boron incorporation, greater than or about 90% boron incorporation, greater than or about 95% boron incorporation, or greater, including a film that is substantially or essentially boron, less the amount of dopant within the film. Although trace materials from exposure to atmosphere or other process environments may be incorporated within the film, it is to be understood that the film may still be essentially boron-based in nature.

The dopant precursors may include any metal-containing precursor, such as including any metal or transition metal that may be delivered to the processing region in a stable form. Exemplary dopants may include one or more of tungsten, molybdenum, titanium, aluminum, cobalt, ruthenium, tantalum, or any other metal or transition metal that may be incorporated with boron in a mask material. Exemplary precursors may include any number of metal-containing materials, which may be dissociated in plasma to provide the metal dopant for incorporation. For example, non-limiting examples of dopant-containing precursors that may be used in embodiments of the present technology may include tungsten hexafluoride, tungsten hexacarbonyl, molybdenum hexafluoride, molybdenum pentachloride, molybdenum hexacarbonyl, titanium tetrachloride, tetrakis(dimethylamido)titanium, titanium tetrafluoride, trimethylaluminum, aluminum chloride, Bis(N,N'-diisopropylacetamidinato)cobalt, cobaltocene, Bis(ethylcyclopentadienyl)cobalt, Bis(pentamethylcyclopentadienyl)cobalt, Bis(cyclopentadienyl)ruthenium, Bis(ethylcyclopentadienyl)ruthenium, tantalum pentachloride, Pentakis(dimethylamido)tantalum, or any other metal-containing precursor that may be used to provide a metal dopant material for incorporation in a boron-containing material.

In some embodiments the doped-boron material deposited may substantially or essentially consist of boron and one or more of the metal dopant materials. Additionally, in some embodiments along with the metal-containing precursor, an additional dopant precursor may be delivered that may include oxygen or nitrogen, or any other dopant that may adjust the structure of the deposited film to improve transparency, stress, hardness, as well as thermal resistance. Any number of nitrogen-containing precursors or oxygen-containing precursors may be used in embodiments of the present technology. Additionally, combination precursors may be used that include multiple of these elements. For example, an oxygen-containing precursor used in some embodiments may be nitrous oxide, which may provide both oxygen and nitrogen for incorporation within the film. The dopant incorporation may be within any range, which may be related to an extinction coefficient, where the higher the dopant incorporation, the lower the extinction coefficient of the formed film. In some embodiments, the dopant may be selected for compatibility with the other deposition precursors.

The dopant or dopants may be included in any amount or concentration, and may each or collectively be included at greater than or about 1 at. % in the deposited film, and in some embodiments may be included at greater than or about 2 at. %, greater than or about 3 at. %, greater than or about 4 at. %, greater than or about 5 at. %, greater than or about 6 at. %, greater than or about 7 at. %, greater than or about 8 at. %, greater than or about 9 at. %, greater than or about 10 at. %, greater than or about 11 at. %, greater than or about 12 at. %, greater than or about 13 at. %, greater than or about 14 at. %, greater than or about 15 at. %, greater than or about 16 at. %, greater than or about 17 at. %, greater than or about 18 at. %, greater than or about 19 at. %, greater than or about 20 at. %, or more. However, as explained above, metal dopants may reduce transparency as well as hardness, and thus in some embodiments the metal dopant concentration may be maintained at less than or about 20 at. %, less than or about 15 at. %, less than or about 12 at. %, less than or about 10 at. %, or less. Oxygen and/or nitrogen dopants may similarly be maintained at levels within these ranges as noted, which may further tune film characteristics. Although oxygen and/or nitrogen incorporation may facilitate improvements in extinction coefficient or film stress, the materials may reduce etch selectivity. Accordingly, incorporation of oxygen and nitrogen may be limited or excluded to maintain higher etch selectivity. An additional hydrogen precursor, such as diatomic hydrogen, may be included in the deposition precursors, which may affect film transparency. Additionally, one or more carrier gases may be delivered, such as argon, to facilitate the deposition operations.

The temperatures of the substrate may additionally impact the deposition. For example, in some embodiments during deposition, the substrate may be maintained at a temperature of greater than or about 300° C., and may be maintained at a temperature of greater than or about 325° C., greater than or about 350° C., greater than or about 375° C., greater than or about 400° C., greater than or about 425° C., greater than or about 450° C., greater than or about 475° C., greater than or about 500° C., greater than or about 525° C., greater than or about 550° C., greater than or about 575° C., greater than or about 600° C., or greater. By performing the deposition according to some embodiments of the present technology, hydrogen may be reduced or limited within the film. Increased hydrogen incorporation may increase a compressive stress within the film, and thus films according to embodiments of the present technology may be characterized by a more tensile nature due to lower hydrogen incorporation. Additionally, in some embodiments, method 200 may include operations that may further reduce hydrogen incorporation in the film. Unlike some conventional technologies, by incorporating dopants according to embodiments of the present technology, damage from subsequent processing may be reduced or limited, such as by performing a thermal anneal subsequent deposition of the hard mask material in some embodiments.

As noted above, the present technology may increase selectivity of hard mask films, while limiting a loss in hardness. For example, metal-doped boron-containing materials according to some embodiments of the present technology may be characterized by a film hardness that is maintained at greater than or about 20 GPa, and may be maintained at greater than or about 22 GPa, greater than or about 24 GPa, greater than or about 26 GPa, greater than or about 28 GPa, greater than or about 30 GPa, greater than or about 32 GPa, greater than or about 34 GPa, greater than or about 36 GPa, greater than or about 38 GPa, greater than or about 40 GPa, greater than or about 42 GPa, greater than or about 44 GPa, or more, despite incorporation of some metal materials that may reduce film hardness. Additionally, the film may have increased selectivity during a subsequent etching operation. For example, in some embodiments, method 200 may additionally include an operation to etch materials on the substrate. For example, in some embodiments the doped-boron mask material may be formed over a silicon-containing material, such as may be silicon oxide or silicon nitride.

In some embodiments, method 200 may include an etch process at optional operation 230, which may etch an underlying silicon oxide, silicon nitride, a combination of the two, or other structural materials that may be etched with hardmasks according to the present technology. In some embodiments, the metal-doped boron-containing material may be characterized by an etch selectivity relative to underlying oxide and/or nitride materials such that the underlying materials may etch at a rate that is greater than or about 2 times the rate at which the metal-doped, boron-containing material may etch. Additionally, the silicon oxide or silicon nitride may etch at a rate that is greater than or about 3.0 times the rate at which the metal-doped, boron-containing material may etch, greater than or about 3.5 times, greater than or about 4.0 times, greater than or about 4.5 times, greater than or about 5.0 times, greater than or about 5.5 times, greater than or about 6.0 times, greater than or about 6.5 times, greater than or about 7.0 times, greater than or about 7.5 times, greater than or about 8.0 times, greater than or about 8.5 times, greater than or about 9.0 times, greater than or about 9.5 times, greater than or about 10.0 times or more times the rate at which the metal-doped, boron-containing material may etch. This may be at least twice as selective to the underlying films compared to other hardmask materials, such as amorphous silicon. Consequently, by increasing the etch selectivity relative to underlying films, the metal-doped boron-containing material may be formed to a reduced thickness, which may improve or maintain transparency of the film despite incorporation of the metal material.

Hardmask films including metal according to some embodiments of the present technology may be characterized by extinction coefficients for light at different wavelengths, which may impact lithography operations. By controlling dopant incorporation to limit mask thickness according to embodiments of the present technology, including by adding oxygen and/or nitrogen dopants, extinction coefficients at 633 nm may be reduced to below or about 0.45, and may be reduced to less than or about 0.44, less than or about 0.43, less than or about 0.42, less than or about 0.41, less than or about 0.40, less than or about 0.39, less than or about 0.38, less than or about 0.37, less than or about 0.36, less than or about 0.35, less than or about 0.34, less than or about 0.33, less than or about 0.32, less than or about 0.31, less than or about 0.30, less than or about 0.29, less than or about 0.28, less than or about 0.27, less than or about 0.26, less than or about 0.25, or less. This may allow lithography to extend to thicknesses of greater than or about 300 nm, greater than or about 350 nm, greater than or about 400 nm, or more, without performing additional alignment key opening operations.

Additionally, some embodiments of the present technology may produce a bilayer hard mask, which may further limit the impact of incorporation of metal-materials, while providing improved selectivity with respect to materials being etched. For example, such as was previously explained with optional deposition operation 215, method 200 may initially include forming a plasma of one or more boron-containing precursors in the semiconductor processing region. The process may include maintaining the processing region free of a metal-containing dopant precursor during this initial process, which may initially deposit a boron-containing layer on the semiconductor substrate. The first layer, which may be maintained metal-dopant free, may be formed to a first thickness on the semiconductor substrate. Subsequently, after a first period of time to develop the thickness of the first layer, the dopant precursor may then be provided at operation 220. A second layer including a boron-doped material may then be deposited on the first layer of boron-containing film to produce a bilayer film or hard mask. The plasma and flow of the boron-containing precursor may be maintained during the process, with the addition of the dopant-containing precursor subsequent the first period of time. The deposition may then proceed for a second period of time until a desired thickness of the second layer, which may be the metal doped layer, may be provided.

The first period of time and the second period of time may be based on the desired thickness of the layers. For example, in some embodiments the first period of time may be less than or equal to the second period of time, where the produced bilayer may have an equal thickness of the two layers, or the second, doped layer may be thicker than the first layer. Accordingly, in some embodiments the second layer of the doped-boron material may be greater than or about 25% of a thickness of the bilayer film, and the second layer may be greater than or about 30% of a thickness of the bilayer film, greater than or about 35% of a thickness of the bilayer film, greater than or about 40% of a thickness of the bilayer film, greater than or about 45% of a thickness of the bilayer film, greater than or about 50% of a thickness of the bilayer film, greater than or about 55% of a thickness of the bilayer film, greater than or about 60% of a thickness of the bilayer film, greater than or about 65% of a thickness of the bilayer film, greater than or about 70% of a thickness of the bilayer film, greater than or about 75% of a thickness of the bilayer film, greater than or about 80% of a thickness of the bilayer film, greater than or about 85% of a thickness of the bilayer film, greater than or about 90% of a thickness of the bilayer film, or more. By utilizing metal-doped mask materials according to embodiments of the present technology, improved selectivity may be afforded to facilitate production at future process nodes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
   delivering a boron-containing precursor to a processing region of a semiconductor processing chamber;
   delivering a dopant-containing precursor with the boron-containing precursor, wherein the dopant-containing precursor includes a metal;
   forming a plasma of all precursors within the processing region of the semiconductor processing chamber; and
   depositing a doped-boron material on a substrate disposed within the processing region of the semiconductor processing chamber, wherein the doped-boron material includes greater than or about 80 at. % of boron in the doped-boron material, and wherein a metal dopant concentration within the doped-boron material is maintained at less than or about 20 at. %.

2. The deposition method of claim 1, wherein the metal in the dopant-containing precursor comprises one or more of tungsten, molybdenum, titanium, aluminum, cobalt, ruthenium, or tantalum.

3. The deposition method of claim 2, wherein the dopant-containing precursor comprises tungsten hexafluoride or tungsten hexacarbonyl.

4. The deposition method of claim 1, wherein the doped-boron material is characterized by an extinction coefficient of less than or about 0.45 at 633 nm.

5. The deposition method of claim 1, further comprising:
delivering an oxygen-containing precursor or a nitrogen-containing precursor with the boron-containing precursor.

6. The deposition method of claim 5, wherein an oxygen content or a nitrogen content within the doped-boron material is maintained at less than or about 10%.

7. The deposition method of claim 1, wherein the doped-boron material is characterized by a hardness of greater than or about 25 GPa.

8. The deposition method of claim 7, wherein the substrate comprises silicon oxide, the deposition method further comprising:
etching the silicon oxide, wherein the silicon oxide etches at a rate greater than or about five times the rate at which the doped-boron material is etched.

9. A deposition method comprising:
delivering a boron-containing precursor to a processing region of a semiconductor processing chamber;
forming a plasma of the boron-containing precursor within the processing region of the semiconductor processing chamber;
forming a first layer of boron-containing material on a substrate disposed within the processing region of the semiconductor processing chamber, wherein the first layer of boron-containing material is metal-dopant free;
adding a dopant-containing precursor with the boron-containing precursor, wherein the dopant-containing precursor includes a metal; and
forming a second layer of a doped-boron material on the first layer of boron-containing material to produce a bilayer film.

10. The deposition method of claim 9, wherein a metal dopant concentration within the second layer of the bilayer film is maintained at less than or about 10 at. %.

11. The deposition method of claim 10, wherein the metal in the dopant-containing precursor comprises one or more of tungsten, molybdenum, titanium, aluminum, cobalt, ruthenium, or tantalum.

12. The deposition method of claim 9, wherein the second layer of the doped-boron material comprises greater than or about 50% of a thickness of the bilayer film.

13. The deposition method of claim 12, wherein the doped-boron material is characterized by a hardness of greater than or about 25 GPa.

14. The deposition method of claim 9, wherein the substrate comprises silicon oxide, the deposition method further comprising:
etching the silicon oxide.

15. The deposition method of claim 14, wherein the silicon oxide etches at a rate greater than or about 1.5 times the rate at which the bilayer film is etched.

16. A deposition method comprising:
delivering a boron-containing precursor to a processing region of a semiconductor processing chamber;
delivering a dopant-containing precursor with the boron-containing precursor, wherein the dopant-containing precursor includes a metal;
forming a plasma of all precursors within the processing region of the semiconductor processing chamber; and
depositing a doped-boron material on a substrate disposed within the processing region of the semiconductor processing chamber, wherein the doped-boron material includes less than or about 20 at. % of metal in the doped-boron material.

17. The deposition method of claim 16, wherein the metal in the dopant-containing precursor comprises one or more of tungsten, molybdenum, titanium, aluminum, cobalt, ruthenium, or tantalum.

18. The deposition method of claim 16, wherein the doped-boron material is characterized by an extinction coefficient of less than or about 0.45 at 633 nm.

19. The deposition method claim 16, wherein the substrate comprises silicon oxide, the deposition method further comprising:
etching the silicon oxide, wherein the silicon oxide etches at a rate greater than or about five times the rate at which the doped-boron material is etched.

* * * * *